(12) United States Patent
Dean et al.

(10) Patent No.: US 9,348,377 B2
(45) Date of Patent: May 24, 2016

(54) THERMAL ISOLATION TECHNIQUES (71) Applicant: SanDisk Enterprise IP LLC, Milpitas, CA (US)

(72) Inventors: David Dean, Litchfield Park, AZ (US); Robert W. Ellis, Phoenix, AZ (US)

(73) Assignee: SANDISK ENTERPRISE IP LLC, Milpitas, CA (US)

( * ) Notice: Subject to any disclaimer, the term of this patent is extended or adjusted under 35 U.S.C. 154(b) by 71 days.

(21) Appl. No.: 14/244,734

(22) Filed: Apr. 3, 2014

(65) Prior Publication Data

US 2015/0261266 A1  Sep. 17, 2015

Related U.S. Application Data

(60) Provisional application No. 61/953,691, filed on Mar. 14, 2014.

(51) Int. Cl.
*G06F 1/20* (2006.01)
*H05K 7/20* (2006.01)

(52) U.S. Cl.
CPC *G06F 1/20* (2013.01); *G06F 1/203* (2013.01); *H05K 7/20* (2013.01)

(58) Field of Classification Search
None
See application file for complete search history.

(56) References Cited

U.S. PATENT DOCUMENTS

| | | | |
|---|---|---|---|
| 4,839,587 A | 6/1989 | Flatley et al. | |
| 4,916,652 A | 4/1990 | Schwarz et al. | |
| 5,210,680 A | 5/1993 | Scheibler | |
| 5,489,805 A | 2/1996 | Hackitt et al. | |
| 5,519,847 A | 5/1996 | Fandrich et al. | |

(Continued)

FOREIGN PATENT DOCUMENTS

| | | |
|---|---|---|
| CN | 201 655 782 | 11/2010 |
| CN | 102 446 873 | 5/2012 |

(Continued)

OTHER PUBLICATIONS

International Search Report and Written Opinion dated Dec. 16, 2014, received in International Patent Application No. PCT/US2014/059114, which corresponds to U.S. Appl. No. 14/135,223, 9 pages (Dean).

(Continued)

*Primary Examiner* — Courtney Smith
(74) *Attorney, Agent, or Firm* — Morgan, Lewis & Bockius LLP (57) ABSTRACT

Various embodiments described herein include systems, methods and/or devices used to dissipate heat generated by electronic components in an electronic system (e.g., a memory system that includes closely spaced memory modules). In one aspect, an electronic assembly includes a first circuit board with one or more heat generating components coupled thereto. The electronic assembly further includes a second circuit board with one or more heat sensitive components coupled thereto. The electronic assembly also includes a thermal barrier interconnect. The thermal barrier interconnect electrically couples the first circuit board to the second circuit board. In some embodiments, thermal barrier interconnect is a flexible interconnect with a lower thermal conductivity than the first circuit board and the second circuit board. The thermal barrier interconnect forms a thermal barrier between the first and second circuit boards which protects the heat sensitive components from the heat generating components.

23 Claims, 5 Drawing Sheets

(56) References Cited

U.S. PATENT DOCUMENTS

| | | | |
|---|---|---|---|
| 5,530,705 A | 6/1996 | Malone | |
| 5,537,555 A | 7/1996 | Landry | |
| 5,551,003 A | 8/1996 | Mattson et al. | |
| 5,628,031 A | 5/1997 | Kikinis et al. | |
| 5,657,332 A | 8/1997 | Auclair et al. | |
| 5,666,114 A | 9/1997 | Brodie et al. | |
| 5,705,850 A | 1/1998 | Ashiwake et al. | |
| 5,708,849 A | 1/1998 | Coke et al. | |
| 5,763,950 A | 6/1998 | Fujisaki et al. | |
| 5,828,549 A | 10/1998 | Gandre et al. | |
| 5,923,532 A | 7/1999 | Nedved | |
| 5,943,692 A | 8/1999 | Marberg et al. | |
| 5,946,190 A | 8/1999 | Patel et al. | |
| 5,973,920 A | 10/1999 | Altic et al. | |
| 5,982,664 A | 11/1999 | Watanabe | |
| 6,000,006 A | 12/1999 | Bruce et al. | |
| 6,008,987 A | 12/1999 | Gale et al. | |
| 6,009,938 A | 1/2000 | Smith et al. | |
| 6,016,560 A | 1/2000 | Wada et al. | |
| 6,018,304 A | 1/2000 | Bessios | |
| 6,031,730 A * | 2/2000 | Kroske | H01R 9/096 361/784 |
| 6,058,012 A | 5/2000 | Cooper et al. | |
| 6,061,245 A | 5/2000 | Ingraham et al. | |
| 6,070,074 A | 5/2000 | Perahia et al. | |
| 6,084,773 A | 7/2000 | Nelson et al. | |
| 6,138,261 A | 10/2000 | Wilcoxson et al. | |
| 6,182,264 B1 | 1/2001 | Ott | |
| 6,192,092 B1 | 2/2001 | Dizon et al. | |
| 6,295,592 B1 | 9/2001 | Jeddeloh et al. | |
| 6,311,263 B1 | 10/2001 | Barlow et al. | |
| 6,335,862 B1 | 1/2002 | Koya | |
| 6,411,511 B1 | 6/2002 | Chen | |
| 6,442,076 B1 | 8/2002 | Roohparvar | |
| 6,449,625 B1 | 9/2002 | Wang | |
| 6,484,224 B1 | 11/2002 | Robins et al. | |
| 6,507,101 B1 | 1/2003 | Morris | |
| 6,516,437 B1 | 2/2003 | Van Stralen et al. | |
| 6,528,878 B1 | 3/2003 | Daikoku et al. | |
| 6,541,310 B1 | 4/2003 | Lo et al. | |
| 6,570,762 B2 | 5/2003 | Cross et al. | |
| 6,618,249 B2 | 9/2003 | Fairchild | |
| 6,621,705 B1 | 9/2003 | Ballenger et al. | |
| 6,678,788 B1 | 1/2004 | O'Connell | |
| 6,757,768 B1 | 6/2004 | Potter et al. | |
| 6,762,942 B1 | 7/2004 | Smith | |
| 6,775,792 B2 | 8/2004 | Ulrich et al. | |
| 6,810,440 B2 | 10/2004 | Micalizzi, Jr. et al. | |
| 6,836,808 B2 | 12/2004 | Bunce et al. | |
| 6,836,815 B1 | 12/2004 | Purcell et al. | |
| 6,842,436 B2 | 1/2005 | Moeller | |
| 6,871,257 B2 | 3/2005 | Conley et al. | |
| 6,892,801 B1 | 5/2005 | Kim | |
| 6,895,464 B2 | 5/2005 | Chow et al. | |
| 6,934,152 B1 | 8/2005 | Barrow | |
| 6,978,343 B1 | 12/2005 | Ichiriu | |
| 6,980,985 B1 | 12/2005 | Amer-Yahia et al. | |
| 6,981,205 B2 | 12/2005 | Fukushima et al. | |
| 6,988,171 B2 | 1/2006 | Beardsley et al. | |
| 6,997,720 B2 * | 2/2006 | Perret | H05K 1/147 439/493 |
| 7,020,017 B2 | 3/2006 | Chen et al. | |
| 7,030,482 B2 | 4/2006 | Haines | |
| 7,032,123 B2 | 4/2006 | Kane et al. | |
| 7,043,505 B1 | 5/2006 | Teague et al. | |
| 7,075,788 B2 | 7/2006 | Larson et al. | |
| 7,079,972 B1 | 7/2006 | Wood et al. | |
| 7,100,002 B2 | 8/2006 | Shrader et al. | |
| 7,111,293 B1 | 9/2006 | Hersh et al. | |
| 7,162,678 B2 | 1/2007 | Saliba | |
| 7,173,852 B2 | 2/2007 | Gorobets et al. | |
| 7,184,446 B2 | 2/2007 | Rashid et al. | |
| 7,233,501 B1 | 6/2007 | Ingalz | |
| 7,280,364 B2 | 10/2007 | Harris et al. | |
| 7,328,377 B1 | 2/2008 | Lewis et al. | |
| 7,474,528 B1 | 1/2009 | Olesiewicz | |
| 7,480,147 B2 | 1/2009 | Hoss et al. | |
| 7,516,292 B2 | 4/2009 | Kimura et al. | |
| 7,523,157 B2 | 4/2009 | Aguilar, Jr. et al. | |
| 7,527,466 B2 | 5/2009 | Simmons | |
| 7,529,466 B2 | 5/2009 | Takahashi | |
| 7,571,277 B2 | 8/2009 | Mizushima | |
| 7,574,554 B2 | 8/2009 | Tanaka et al. | |
| 7,595,994 B1 | 9/2009 | Sun | |
| 7,596,643 B2 | 9/2009 | Merry et al. | |
| 7,599,182 B2 | 10/2009 | Sun | |
| 7,623,343 B2 | 11/2009 | Chen | |
| 7,681,106 B2 | 3/2010 | Jarrar et al. | |
| 7,685,494 B1 | 3/2010 | Varnica et al. | |
| 7,707,481 B2 | 4/2010 | Kirschner et al. | |
| 7,761,655 B2 | 7/2010 | Mizushima et al. | |
| 7,774,390 B2 | 8/2010 | Shin | |
| 7,840,762 B2 | 11/2010 | Oh et al. | |
| 7,870,326 B2 | 1/2011 | Shin et al. | |
| 7,890,818 B2 | 2/2011 | Kong et al. | |
| 7,913,022 B1 | 3/2011 | Baxter | |
| 7,925,960 B2 | 4/2011 | Ho et al. | |
| 7,934,052 B2 | 4/2011 | Prins et al. | |
| 7,954,041 B2 | 5/2011 | Hong et al. | |
| 7,959,445 B1 | 6/2011 | Daily et al. | |
| 7,961,462 B2 | 6/2011 | Hernon | |
| 7,971,112 B2 | 6/2011 | Murata | |
| 7,974,368 B2 | 7/2011 | Shieh et al. | |
| 7,978,516 B2 | 7/2011 | Olbrich | |
| 7,980,863 B1 * | 7/2011 | Holec | H05K 3/363 439/67 |
| 7,989,709 B2 * | 8/2011 | Tsao | H05K 1/148 174/264 |
| 7,996,642 B1 | 8/2011 | Smith | |
| 8,000,096 B2 * | 8/2011 | Nemoz | H05K 7/1452 312/223.1 |
| 8,006,161 B2 | 8/2011 | Lestable et al. | |
| 8,032,724 B1 | 10/2011 | Smith | |
| 8,069,390 B2 | 11/2011 | Lin | |
| 8,190,967 B2 | 5/2012 | Hong et al. | |
| 8,198,539 B2 | 6/2012 | Otoshi et al. | |
| 8,208,252 B2 | 6/2012 | Tolliver | |
| 8,254,181 B2 | 8/2012 | Hwang et al. | |
| 8,305,103 B2 | 11/2012 | Kang et al. | |
| 8,312,349 B2 | 11/2012 | Reche et al. | |
| 8,373,986 B2 | 2/2013 | Sun | |
| 8,405,985 B1 | 3/2013 | Reynov et al. | |
| 8,412,985 B1 | 4/2013 | Bowers et al. | |
| 8,472,183 B1 | 6/2013 | Ross et al. | |
| 8,477,495 B2 | 7/2013 | Sun | |
| 8,570,740 B2 | 10/2013 | Cong et al. | |
| 8,599,560 B2 * | 12/2013 | Wu | G06F 1/20 174/252 |
| 9,089,073 B2 | 7/2015 | Reynov et al. | |
| 2002/0008963 A1 | 1/2002 | DiBene, II et al. | |
| 2002/0024846 A1 | 2/2002 | Kawahara et al. | |
| 2002/0076951 A1 | 6/2002 | Roy | |
| 2002/0083299 A1 | 6/2002 | Van Huben et al. | |
| 2002/0123259 A1 * | 9/2002 | Yatskov | H01R 12/62 439/329 |
| 2002/0152305 A1 | 10/2002 | Jackson et al. | |
| 2002/0162075 A1 | 10/2002 | Talagala et al. | |
| 2002/0165896 A1 | 11/2002 | Kim | |
| 2003/0041299 A1 | 2/2003 | Kanazawa et al. | |
| 2003/0043829 A1 | 3/2003 | Rashid | |
| 2003/0088805 A1 | 5/2003 | Majni et al. | |
| 2003/0093628 A1 | 5/2003 | Matter et al. | |
| 2003/0184970 A1 | 10/2003 | Bosch et al. | |
| 2003/0188045 A1 | 10/2003 | Jacobson | |
| 2003/0189856 A1 | 10/2003 | Cho et al. | |
| 2003/0198100 A1 | 10/2003 | Matsushita et al. | |
| 2003/0212719 A1 | 11/2003 | Yasuda et al. | |
| 2004/0024957 A1 | 2/2004 | Lin et al. | |
| 2004/0024963 A1 | 2/2004 | Talagala et al. | |
| 2004/0073829 A1 | 4/2004 | Olarig | |
| 2004/0153902 A1 | 8/2004 | Machado et al. | |
| 2004/0181734 A1 | 9/2004 | Saliba | |
| 2004/0199714 A1 | 10/2004 | Estakhri et al. | |
| 2004/0218367 A1 | 11/2004 | Lin et al. | |

(56) References Cited

U.S. PATENT DOCUMENTS

| | | |
|---|---|---|
| 2004/0237018 A1 | 11/2004 | Riley |
| 2005/0009382 A1* | 1/2005 | Burmeister .......... H01R 4/5058 439/67 |
| 2005/0013120 A1 | 1/2005 | Liu |
| 2005/0060456 A1 | 3/2005 | Shrader et al. |
| 2005/0060501 A1 | 3/2005 | Shrader |
| 2005/0082663 A1 | 4/2005 | Wakiyama et al. |
| 2005/0114587 A1 | 5/2005 | Chou et al. |
| 2005/0152112 A1 | 7/2005 | Holmes et al. |
| 2005/0172065 A1 | 8/2005 | Keays |
| 2005/0172207 A1 | 8/2005 | Radke et al. |
| 2005/0193161 A1 | 9/2005 | Lee et al. |
| 2005/0201148 A1 | 9/2005 | Chen et al. |
| 2005/0231765 A1 | 10/2005 | So et al. |
| 2005/0257120 A1 | 11/2005 | Gorobets et al. |
| 2005/0273560 A1 | 12/2005 | Hulbert et al. |
| 2005/0289314 A1 | 12/2005 | Adusumilli et al. |
| 2006/0039196 A1 | 2/2006 | Gorobets et al. |
| 2006/0042291 A1 | 3/2006 | Petroski |
| 2006/0053246 A1 | 3/2006 | Lee |
| 2006/0067066 A1 | 3/2006 | Meier et al. |
| 2006/0085671 A1 | 4/2006 | Majni et al. |
| 2006/0133041 A1 | 6/2006 | Belady et al. |
| 2006/0136570 A1 | 6/2006 | Pandya |
| 2006/0156177 A1 | 7/2006 | Kottapalli et al. |
| 2006/0195650 A1 | 8/2006 | Su et al. |
| 2006/0259528 A1 | 11/2006 | Dussud et al. |
| 2007/0001282 A1 | 1/2007 | Kang et al. |
| 2007/0011413 A1 | 1/2007 | Nonaka et al. |
| 2007/0057686 A1 | 3/2007 | Suga et al. |
| 2007/0058446 A1 | 3/2007 | Hwang et al. |
| 2007/0061597 A1 | 3/2007 | Holtzman et al. |
| 2007/0074850 A1 | 4/2007 | Peschl |
| 2007/0076479 A1 | 4/2007 | Kim et al. |
| 2007/0081408 A1 | 4/2007 | Kwon et al. |
| 2007/0083697 A1 | 4/2007 | Birrell et al. |
| 2007/0097653 A1 | 5/2007 | Gilliland et al. |
| 2007/0113019 A1 | 5/2007 | Beukema |
| 2007/0121297 A1 | 5/2007 | Uchizono et al. |
| 2007/0133312 A1 | 6/2007 | Roohparvar |
| 2007/0147113 A1 | 6/2007 | Mokhlesi et al. |
| 2007/0150790 A1 | 6/2007 | Gross et al. |
| 2007/0157064 A1 | 7/2007 | Falik et al. |
| 2007/0174579 A1 | 7/2007 | Shin |
| 2007/0180188 A1 | 8/2007 | Fujibayashi et al. |
| 2007/0208901 A1 | 9/2007 | Purcell et al. |
| 2007/0211426 A1 | 9/2007 | Clayton et al. |
| 2007/0211436 A1 | 9/2007 | Robinson et al. |
| 2007/0216005 A1 | 9/2007 | Yim et al. |
| 2007/0216009 A1 | 9/2007 | Ng |
| 2007/0230111 A1 | 10/2007 | Starr et al. |
| 2007/0234143 A1 | 10/2007 | Kim |
| 2007/0245061 A1 | 10/2007 | Harriman |
| 2007/0246189 A1 | 10/2007 | Lin et al. |
| 2007/0247805 A1 | 10/2007 | Fujie et al. |
| 2007/0277036 A1 | 11/2007 | Chamberlain et al. |
| 2007/0291556 A1 | 12/2007 | Kamei |
| 2007/0294496 A1 | 12/2007 | Goss et al. |
| 2007/0300130 A1 | 12/2007 | Gorobets |
| 2008/0019095 A1 | 1/2008 | Liu |
| 2008/0019182 A1 | 1/2008 | Yanagidaira et al. |
| 2008/0022163 A1 | 1/2008 | Tanaka et al. |
| 2008/0026637 A1* | 1/2008 | Minich .................. H05K 1/14 439/607.05 |
| 2008/0043435 A1 | 2/2008 | Yip et al. |
| 2008/0052435 A1 | 2/2008 | Norwood et al. |
| 2008/0052446 A1 | 2/2008 | Lasser et al. |
| 2008/0068796 A1 | 3/2008 | Pav et al. |
| 2008/0077841 A1 | 3/2008 | Gonzalez et al. |
| 2008/0077937 A1 | 3/2008 | Shin et al. |
| 2008/0086677 A1 | 4/2008 | Yang et al. |
| 2008/0144371 A1 | 6/2008 | Yeh et al. |
| 2008/0147964 A1 | 6/2008 | Chow et al. |
| 2008/0147998 A1 | 6/2008 | Jeong |
| 2008/0148124 A1 | 6/2008 | Zhang et al. |
| 2008/0158818 A1 | 7/2008 | Clidaras et al. |
| 2008/0163030 A1 | 7/2008 | Lee |
| 2008/0168191 A1 | 7/2008 | Biran et al. |
| 2008/0168319 A1 | 7/2008 | Lee et al. |
| 2008/0170460 A1 | 7/2008 | Oh et al. |
| 2008/0229000 A1 | 9/2008 | Kim |
| 2008/0229003 A1 | 9/2008 | Mizushima et al. |
| 2008/0229176 A1 | 9/2008 | Arnez et al. |
| 2008/0236791 A1 | 10/2008 | Wayman |
| 2008/0252324 A1 | 10/2008 | Barabi et al. |
| 2008/0254573 A1 | 10/2008 | Sir et al. |
| 2008/0266807 A1 | 10/2008 | Lakin et al. |
| 2008/0270680 A1 | 10/2008 | Chang |
| 2008/0282128 A1 | 11/2008 | Lee et al. |
| 2008/0285351 A1 | 11/2008 | Shlick et al. |
| 2008/0291636 A1 | 11/2008 | Mori et al. |
| 2009/0003058 A1 | 1/2009 | Kang |
| 2009/0037652 A1 | 2/2009 | Yu et al. |
| 2009/0144598 A1 | 6/2009 | Yoon et al. |
| 2009/0168525 A1 | 7/2009 | Olbrich et al. |
| 2009/0172258 A1 | 7/2009 | Olbrich et al. |
| 2009/0172259 A1 | 7/2009 | Prins et al. |
| 2009/0172260 A1 | 7/2009 | Olbrich et al. |
| 2009/0172261 A1 | 7/2009 | Prins et al. |
| 2009/0172262 A1 | 7/2009 | Olbrich et al. |
| 2009/0172308 A1 | 7/2009 | Prins et al. |
| 2009/0172335 A1 | 7/2009 | Kulkarni et al. |
| 2009/0172499 A1 | 7/2009 | Olbrich et al. |
| 2009/0190308 A1 | 7/2009 | Bhattacharya et al. |
| 2009/0193058 A1 | 7/2009 | Reid |
| 2009/0207660 A1 | 8/2009 | Hwang et al. |
| 2009/0222708 A1 | 9/2009 | Yamaga |
| 2009/0228761 A1 | 9/2009 | Perlmutter et al. |
| 2009/0273898 A1 | 11/2009 | Imsand |
| 2009/0296466 A1 | 12/2009 | Kim et al. |
| 2009/0296486 A1 | 12/2009 | Kim et al. |
| 2009/0302458 A1 | 12/2009 | Kubo et al. |
| 2009/0309214 A1 | 12/2009 | Szewerenko et al. |
| 2009/0319864 A1 | 12/2009 | Shrader |
| 2010/0008034 A1 | 1/2010 | Hinkle |
| 2010/0061151 A1 | 3/2010 | Miwa et al. |
| 2010/0073860 A1* | 3/2010 | Moriai ................ G06F 3/0626 361/679.32 |
| 2010/0073880 A1 | 3/2010 | Liu |
| 2010/0091463 A1 | 4/2010 | Buresch et al. |
| 2010/0103737 A1 | 4/2010 | Park |
| 2010/0118496 A1 | 5/2010 | Lo |
| 2010/0161936 A1 | 6/2010 | Royer et al. |
| 2010/0164525 A1 | 7/2010 | Han et al. |
| 2010/0199125 A1 | 8/2010 | Reche |
| 2010/0202196 A1 | 8/2010 | Lee et al. |
| 2010/0208521 A1 | 8/2010 | Kim et al. |
| 2010/0224985 A1 | 9/2010 | Michael et al. |
| 2010/0262889 A1 | 10/2010 | Bains |
| 2010/0281207 A1 | 11/2010 | Miller et al. |
| 2010/0281342 A1 | 11/2010 | Chang et al. |
| 2010/0296255 A1 | 11/2010 | Maloney |
| 2010/0319986 A1 | 12/2010 | Bleau et al. |
| 2010/0328887 A1 | 12/2010 | Refai-Ahmed et al. |
| 2011/0083060 A1 | 4/2011 | Sakurada et al. |
| 2011/0113281 A1 | 5/2011 | Zhang et al. |
| 2011/0131444 A1 | 6/2011 | Buch et al. |
| 2011/0132000 A1 | 6/2011 | Deane et al. |
| 2011/0173378 A1 | 7/2011 | Filor et al. |
| 2011/0182035 A1 | 7/2011 | Yajima |
| 2011/0188205 A1 | 8/2011 | MacManus et al. |
| 2011/0205823 A1 | 8/2011 | Hemink et al. |
| 2011/0213920 A1 | 9/2011 | Frost et al. |
| 2011/0228601 A1 | 9/2011 | Olbrich et al. |
| 2011/0231600 A1 | 9/2011 | Tanaka et al. |
| 2011/0299244 A1 | 12/2011 | Dede et al. |
| 2011/0317359 A1 | 12/2011 | Wei et al. |
| 2012/0014067 A1 | 1/2012 | Siracki |
| 2012/0064781 A1* | 3/2012 | Krishnan ................ H01L 24/40 439/733.1 |
| 2012/0096217 A1 | 4/2012 | Son et al. |
| 2012/0110250 A1 | 5/2012 | Sabbag et al. |
| 2012/0151253 A1 | 6/2012 | Horn |
| 2012/0170224 A1 | 7/2012 | Fowler et al. |

(56) References Cited

U.S. PATENT DOCUMENTS

| | | | |
|---|---|---|---|
| 2012/0195126 A1 | 8/2012 | Roohparvar | |
| 2012/0201007 A1 | 8/2012 | Yeh et al. | |
| 2012/0239976 A1 | 9/2012 | Cometti et al. | |
| 2012/0284587 A1 | 11/2012 | Yu et al. | |
| 2012/0293962 A1 | 11/2012 | McCluskey et al. | |
| 2012/0327598 A1 | 12/2012 | Nakayama | |
| 2013/0155800 A1* | 6/2013 | Shim | G11C 5/04 365/229 |
| 2013/0181733 A1 | 7/2013 | Kikuchi et al. | |
| 2013/0285686 A1 | 10/2013 | Malik et al. | |
| 2013/0294028 A1 | 11/2013 | Lafont et al. | |
| 2013/0307060 A1 | 11/2013 | Wang et al. | |
| 2014/0055944 A1 | 2/2014 | McCabe et al. | |
| 2014/0071614 A1 | 3/2014 | Kaldani | |
| 2014/0153181 A1 | 6/2014 | Peng et al. | |
| 2014/0182814 A1 | 7/2014 | Lin | |

FOREIGN PATENT DOCUMENTS

| | | |
|---|---|---|
| DE | 199 10 500 A1 | 10/2000 |
| DE | 2005 063281 | 7/2007 |
| EP | 0 600 590 A1 | 6/1994 |
| EP | 0 989 794 A2 | 3/2000 |
| EP | 1 465 203 A1 | 10/2004 |
| EP | 1 990 921 A2 | 11/2008 |
| EP | 2 066 158 A2 | 6/2009 |
| EP | 2 395 827 A2 | 12/2011 |
| EP | 2 600 700 A1 | 6/2013 |
| FR | 2560731 | 9/1985 |
| JP | 06006064 | 1/1994 |
| JP | 2002-532806 | 10/2002 |
| JP | 2003 188565 | 7/2003 |
| WO | WO 88 07193 | 3/1988 |
| WO | WO 03/094586 A1 | 11/2003 |
| WO | WO 2004/086827 A2 | 10/2004 |
| WO | WO 2007/036834 | 4/2007 |
| WO | WO 2007/080586 | 7/2007 |
| WO | WO 2008/013850 A2 | 1/2008 |
| WO | WO 2008/121553 | 10/2008 |
| WO | WO 2008/121577 | 10/2008 |
| WO | WO 2009/028281 | 3/2009 |
| WO | WO 2009/032945 | 3/2009 |
| WO | WO 2009/058140 | 5/2009 |
| WO | WO 2009/084724 | 7/2009 |
| WO | WO 2009/134576 | 11/2009 |
| WO | WO 2013/080341 | 6/2013 |

OTHER PUBLICATIONS

International Search Report and Written Opinion dated Nov. 20, 2014, received in International Patent Application No. PCT/US2014/020290, which corresponds to U.S. Appl. No. 13/791,797, 21 pages (Dean).
International Search Report and Written Opinion dated Dec. 23, 2014, received in International Patent Application No. PCT/US2014/042772, which corresponds to U.S. Appl. No. 13/922,105, 10 pages (Dean).
Barr, "Introduction to Watchdog Timers," Oct. 2001, 3 pgs.
Canim, "Buffered Bloom Filters on Solid State Storage," ADMS*10, Singapore Sep. 13-17, 2010, 8 pgs.
Kang, "A Multi-Channel Architecture for High-Performance NAND Flash-Based Storage System," J. Syst. Archit, vol. 53, issue 9, Sep. 2007, 15 pgs.
Kim, "A Space-Efficient Flash Translation Layer for CompactFlash Systems," May 2002, IEEE Vol. 48, No. 2, 10 pgs.
Lu, "A Forest-structured Bloom Filter with Flash Memory," MSST 2011. Denver, CO, May 23-27, 2011, article, 6 pgs.
Lu, "A Forest-structured Bloom Filter with Flash Memory," MSST 2011, Denver, CO, May 23-27, 2011, presentation slides, 25 pgs.
McLean, "Information Technology-AT Attachment with Packet Interface Extension," Aug. 19, 1998, 339 pgs.
Microchip Technology. "Section 10, Watchdog Timer and Power-Saving Modes," 2005, 14 pages.
Park et al., "A High Performance Controller for NAND Flash-Based Solid State Disk (NSSD)," Proceedings of Non-Volatile Semiconductor Memory Workshop, Feb. 2006. 4 pgs.
Zeidman, "Verilog Designer's Library," 1999, 9 pgs.
International Search Report and Written Opinion, dated Mar. 19, 2009 received in International Patent Appiication No. PCT/US08/88133, which corresponds to U.S. Appl. No. 12/082,202, 7 pgs (Prins).
International Search Report and Written Opinion, dated Mar. 19, 2009, received in International Patent Application No. PCT/US08/88136, which corresponds to U.S. Appl. No. 12/082,205, 7 pgs (Oibrich).
International Search Report and Written Opinion dated Feb. 26, 2009, received in International Patent Application No. PCT/US08/88146, which corresponds to U.S. Appl. No. 12/082,221, 10 pgs (Prins).
International Search Report and Written Opinion dated Feb. 27, 2009, received in International Patent Application No. PCT/US2008/088154, which corresponds to U.S. Appl. No. 12/082,207, 8 pgs (Prins).
International Search Report and Written Opinion dated Feb. 13, 2009, received in International Patent Application No. PCT/US08/88164, which corresponds to U.S. Appl. No. 12/082,220, 6 pgs (Olbrich).
International Search Report and Written Opinion dated Feb. 18, 2009, received in International Patent Application No. PCT/US08/88206, which corresponds to U.S. Appl. No. 12/082,206, 8 pgs (Prins).
International Search Report and Written Opinion dated Feb. 19, 2009, received in International Patent Application No. PCT/US08/88217, which corresponds to U.S. Appl. No. 12/082,204, 7 pgs (Olbrich).
International Search Report and Written Opinion dated Feb. 13, 2009, received in International Patent Appiication No. PCT/US08/88229, which corresponds to U.S. Appl. No. 12/082,223, 7 pgs (Olbrich).
International Search Report and Written Opinion dated Feb. 19, 2009, received in International Patent Application No. PCT/US08/88232, which corresponds to U.S. Appl. No. 12/082,222, 8 pgs (Olbrich).
International Search Report and Written Opinion dated Feb. 19, 2009, received in International Patent Application No. PCT/US08/88236, which corresponds to U.S. Appl. No. 12/082,203, 7 pgs (Olbrich).
International Search Report and Written Opinion dated Oct. 27, 2011, received in International Patent Application No. PCT/US2011/028637, which corresponds to U.S. Appl. No. 12/726,200, 11 pgs (Olbrich).
European Search Report dated Feb. 23, 2012, received in European Patent Application No. 08866997.3, which corresponds to U.S. Appl. No. 12/082,207, 6 pgs. (Prins).
Office Action dated Apr. 18, 2012, received in Chinese Patent Application No. 200880127623.8, which cirresponds to U.S. Appl. No. 12/082,207, 12 pgs. (Prins).
Office Action dated Dec. 31, 2012, received in Chinese Patent Application No. 200880127623.8, which correspods to U.S. Appl. No. 12/082,207, 9 pgs (Prins).
Notification of the Decision to Grant a Patent Right for Patent for Invention dated Jul. 4, 2013, received in Chinese Patent Application No. 200880127623.8, which corresponds to U.S. Appl. No. 12/082,207, 1 pg (Prins).
Office Action dated Jul. 24, 2012, received in Japanese Patent Application No. JP 2010-540863, 3 pgs (Prins).
International Search Report and Written Opinion dated Mar. 7, 2014, received in International Patent Application No. PCT/US2013/074772, which corresponds to U.S. Appl. No. 13/831,218, 10 pages (George).
International Search Report and Written Opinion dated Mar. 24, 2014, received in International Patent Application No. PCT/US2013/074777, which corresponds to U.S. Appl. No. 13/831,308, 10 pages (George).

(56) References Cited

OTHER PUBLICATIONS

International Search Report and Written Opinion dated Mar. 7, 2014, received in International Patent Application No. PCT/US2013/074779, which corresponds to U.S. Appl. No. 13/831,374, 8 pages (George).

International Search Report and Written Opinion dated Aug. 31, 2012, received in International Patent Application PCT/US2012/042764, which corresponds to U.S. Appl. No. 13/285,873, 12 pgs (Frayer).

International Search Report and Written Opinion dated Mar. 4, 2013, received in PCT/US2012/042771, which corresponds to U.S. Appl. No. 13/286,012, 14 pgs (Stonelake).

International Search Report and Written Opinion dated Sep. 26, 2012, received in International Patent Application No. PCT/US2012/042775, which corresponds to U.S. Appl. No. 13/285,892, 8 pgs (Weston-Lewis et al.).

International Search Report and Written Opinion dated Jun. 6, 2013, received in International Patent Application No. PCT/US2012/059447, which corresponds to U.S. Appl. No. 13/602,031, 12 pgs (Tai).

International Search Report and Written Opinon dated Jun. 6, 2013, received in International Patent Application No. PCT/US2012/059453, which corresponds to U.S. Appl. No. 13/602,039, 12 pgs (Frayer).

International Search Report and Written Opinion dated Feb. 14, 2013, received in International Patent Application No. PCT/US2012/059459, which corresponds to U.S. Appl. No. 13/602,047, 9 pgs (Tai).

International Search Report and Written Opinion dated May 23, 2013, received in International Patent Application No. PCT/US2012/065914, which corresponds to U.S. Appl. No. 13/679,963, 7 pgs (Frayer).

International Search Report and Written Opinion dated Apr. 5, 2013, received in International Patent Application No. PCT/US2012/065916, which corresponds to U.S. Appl. No. 13/679,969, 7 pgs (Frayer).

International Search Report and Written Opinion dated Jun. 17, 2013, received in International Patent Application No. PCT/US2012/065919, which corresponds to U.S. Appl. No. 13/679,970, 8 pgs (Frayer).

International Search Report and Written Opinion dated May 18, 2015, received in International Patent Application No. PCT/US2015/016656, which corresponds to U.S. Appl. No. 14/275,690, 14 pages (Wright).

International Search Report and Written Opinion dated May 28, 2015, received in International Patent Application No. PCT/US2015/017729, which corresponds to U.S. Appl. No. 14/244,745, 14 pages (Ellis).

International Search Report and Written Opinion dated Apr. 28, 2015 received in International Patent Application No. PCT/US2015/014563, which corresponds to U.S. Appl. No. 14/179,247, 9 pages (Ellis).

International Search Report and Written Opinion dated May 8, 2015, received in International Patent Application No. PCT/US2015/017722, which corresponds to U.S. Appl. No. 14/277,716, 9 pages (Dean).

International Search Report and Written Opinion dated May 13, 2015, received in International Patent Application No. PCT/US2015/017724, which corresponds to U.S. Appl. No. 14/244,734 12 pages, (Dean).

Invitation to Pay Additional Fees dated Jul. 25, 2014, received in International Patent Application No. PCT/US2014/021290, which corresponds to U.S. Appl. No. 13/791,797, 8 pages (Dean).

International Search Report and Written Opinion dated Sep. 12, 2014, received in International Patent Application No. PCT/US2014/043146.

\* cited by examiner

THERMAL ISOLATION TECHNIQUES

RELATED APPLICATIONS

This application claims priority to U.S. Provisional Patent Application Ser. No. 61/953,691, filed Mar. 14, 2014, and titled "Thermal Isolation Techniques," which is incorporated herein by reference in its entirety

TECHNICAL FIELD

The disclosed embodiments relate generally to heat management, and in particular, to dissipating heat generated by electronic components in electronic systems.

BACKGROUND

Electronics, such as processors or memory, generate heat during operation. If left unchecked, this heat can reduce system performance and even lead to partial or complete system failure. As such, many existing technologies attempt to remove or dissipate heat through the use of heat sinks, cooling fans, etc.

While these technologies may be effective for cooling a single electronic component that is not located near other sources of heat, these technologies fall short when it comes to more complex systems and higher density systems, such as solid state drives (SSDs), dual in-line memory modules (DIMMs), and small outline-DIMMs, all of which utilize memory cells to store data as an electrical charge or voltage.

Existing cooling systems for such systems typically include multiple heat sinks and high-speed fans. These cooling systems are noisy; add significant expense to the system; increase the overall energy consumption of these systems; and decrease system efficiency. Moreover, existing cooling systems do not always alleviate localized hot-spots that form within the systems, which in turn shortens the life of the individual components within the system.

In the absence of efficient heat dissipation mechanisms, the increased heat can ultimately lead to reduced performance or failure of either individual memory cells of a memory module or the entire memory module.

Some systems include circuitry that is also sensitive to high temperatures. For example, Solid State Disk (SSD) drives typically contain support circuitry that during normal operation generates a large amount of heat. However, the NAND flash memory used in these designs has a temperature sensitivity that reduces the life of the drive.

A common technique for removing heat from the NAND in an SSD is to integrate a heat sink design in the case design for the drive. However, this presents a problem when the form factor for the SSD does not include a case, e.g., PCIe or embedded SSDs that use a PCBA (printed circuit board assembly) and no case. In other words, many of the heat sinks used for SSDs are an integral part of the case design, and when there is no case, the heat removal is handled by passing large volumes of air over the heat generating components. However, as mentioned above, these cooling systems are noisy; add significant expense to the system; increase the overall energy consumption of these systems; decrease system efficiency, and do not always alleviate localized hot-spots that form within the systems.

In light of these and other issues, it would be desirable to provide a system and method for more effectively cooling electronic components, especially those found in systems that contain multiple heat generating components.

SUMMARY

According to some embodiments there is provided an electronic assembly for dissipating heat. The electronic assembly includes a first circuit board with one or more heat generating components coupled thereto. The electronic assembly further includes a second circuit board with one or more heat sensitive components coupled thereto. The electronic assembly also includes a thermal barrier interconnect. The thermal barrier interconnect electrically couples the first circuit board to the second circuit board. In some embodiments, thermal barrier interconnect is a flexible interconnect with a lower thermal conductivity than the first circuit board and the second circuit board. The thermal barrier interconnect forms a thermal barrier between the first and second circuit boards which protects the heat sensitive components from the heat generating components.

Other embodiments include a method of manufacturing an electronic assembly for dissipating heat. A first circuit board with one or more heat generating components coupled thereto is provides. A second circuit board with one or more heat sensitive components coupled thereto is also provides. A thermal barrier interconnect is provided and it is coupled to the first circuit board to the second circuit board such that the first and second circuit board are electrically coupled to one another.

Some advantages of the embodiments describe herein are as follows. These electronic assemblies provide a means of differential temperature control at design time. They also help to reduce thermal issues on selected device in a single assembly. The flexible interconnect allows for variable form factors, shapes, designs, and/or assemblies. These electronic assemblies allow for segregation of devices or components that have different temperature sensitivities. They increase the life of a solid state drive by increasing data retention from lower device temperatures. For instance, a NAND flash running at a lower temperature will have better data retention and therefore require less recycling of data and lengthen the drive's life. These electronic assemblies are also better at compensating for thermal expansion and contractions over a wide temperature range.

Other embodiments and advantages may be apparent to those skilled in the art in light of the descriptions and drawings in this specification.

BRIEF DESCRIPTION OF THE DRAWINGS

So that the present disclosure can be understood in greater detail, a more particular description may be had by reference to the features of various embodiments, some of which are illustrated in the appended drawings. The appended drawings, however, merely illustrate the more pertinent features of the present disclosure and are therefore not to be considered limiting, for the description may admit to other effective features.

In accordance with common practice the various features illustrated in the drawings may not be drawn to scale. Accordingly, the dimensions of the various features may be arbitrarily expanded or reduced for clarity. In addition, some of the drawings may not depict all of the components of a given system, method or device. Finally, like reference numerals may be used to denote like features throughout the specification and figures.

DETAILED DESCRIPTION

The various embodiments described herein include systems, methods and/or devices used by, or integrated into, electronic assemblies. In particular, the electronic systems, the heat sinks, and the heat dissipation method described herein facilitate dissipation of heat generated by electronic components in the electronic systems.

The embodiments described herein allow for the isolation of heat sensitive devices from heat generating devices on a PCBA (printed circuit board assembly). In some embodiments, by using a thermal barrier interconnect such as a flexible circuit board between two rigid printed circuit boards, a thermal barrier is formed. This thermal barrier is used to allow one board to operate at a reduced temperature in relation to the other board. For instance, a board with NAND flash can operate at a reduced temperature in relation to the board which contains the NAND flash controller and power supply electronics. The difference in temperatures between the boards can be as much as 20 degrees C. This means the NAND flash running at a lower temperature will have better data retention and therefore require less recycling of data (which is Write Amplification), thereby lengthening the drive life.

A thin flexible board which carries the signals does not contain the thermal mass of the rigid FR4 (or other types) board material. As such, the thin flexible board produces in a thermal barrier. In some embodiments, the thermal barrier is further enhanced from the reduction in copper planes, which are found in the rigid boards to supply power and grounds. In some embodiments, the flexible material is made from a kapton or other polyimide materials which has a lower thermal conductivity.

One example of such an electronic system is a memory system that is commonly integrated in many computers and consumer electronic devices. Memory systems frequently include closely placed memory modules that require efficient heat dissipation in order to ensure proper function and life span. Some embodiments are described herein in the context of generic electronic systems. However, one of skill in the art will recognize that the embodiments described herein are suitable for use in a memory system as well as any other appropriate electronic system that includes two or more electronic modules integrated in a limited space and which requires efficient dissipation of generated heat.

More specifically, according to some embodiments, an electronic assembly for dissipating heat is provided. The electronic assembly includes a first circuit board with one or more heat generating components coupled thereto. The electronic assembly further includes a second circuit board with one or more heat sensitive components coupled thereto. The electronic assembly also includes a thermal barrier interconnect. The thermal barrier interconnect electrically couples the first circuit board to the second circuit board.

In some embodiments, the thermal barrier interconnect has a lower thermal conductivity than the first circuit board and the second circuit board.

In some embodiments, the thermal barrier interconnect is a flexible interconnect. In some embodiments, the flexible interconnect is made from a kapton material. In some embodiments, the flexible interconnect is made from a polyimide material.

In some embodiments, the thermal barrier interconnect has a lower thermal mass than the first and circuit boards.

In some embodiments, the thermal barrier interconnect includes power planes for CORE voltage and the I/O voltage.

In some embodiments, the thermal barrier interconnect does not include a plurality of power planes found in the first and second circuit boards.

In some embodiments, the one or more heat generating components include one or more power supply electronic components.

In some embodiments, the one or more heat generating components include a NAND flash controller.

In some embodiments, the one or more heat sensitive components include NAND flash memory.

In some embodiments, the first circuit board, the second circuit board are next to one another in a substantially common plane.

In some embodiments, first circuit board is on a first plane and the second circuit board is on a second plane substantially parallel to the first plane and separated by a space.

Some embodiments also include a fastener configured to couple the first circuit board to the second circuit board. The fastener, first circuit board, second circuit board, and thermal barrier interconnect surround the space and form an air flow channel.

In some embodiments, in operation the first circuit board has a first temperature and the second circuit board has a second temperature lower than the first temperature. In some embodiments, in operation, the second temperature is up to 20 degrees Celsius lower than the first temperature.

In some embodiments, the electronic assembly is a solid state disk drive.

In some embodiments, the electronic assembly does not include a case.

In some embodiments, the electronic assembly does not include a heat sink.

Another aspect of the invention includes a method of manufacturing an electronic assembly for dissipating heat. A first circuit board with one or more heat generating components coupled thereto is provided. A second circuit board with one or more heat sensitive components coupled thereto is also provided. A thermal barrier interconnect is provided and it is coupled to the first circuit board to the second circuit board such that the first and second circuit board are electrically coupled to one another.

Numerous details are described herein in order to provide a thorough understanding of the exemplary embodiments illustrated in the accompanying drawings. However, some embodiments may be practiced without many of the specific details, and the scope of the claims is only limited by those features and aspects specifically recited in the claims. Furthermore, well-known methods, components, and circuits have not been described in exhaustive detail so as not to unnecessarily obscure more pertinent aspects of the embodiments described herein.

Figure 1:
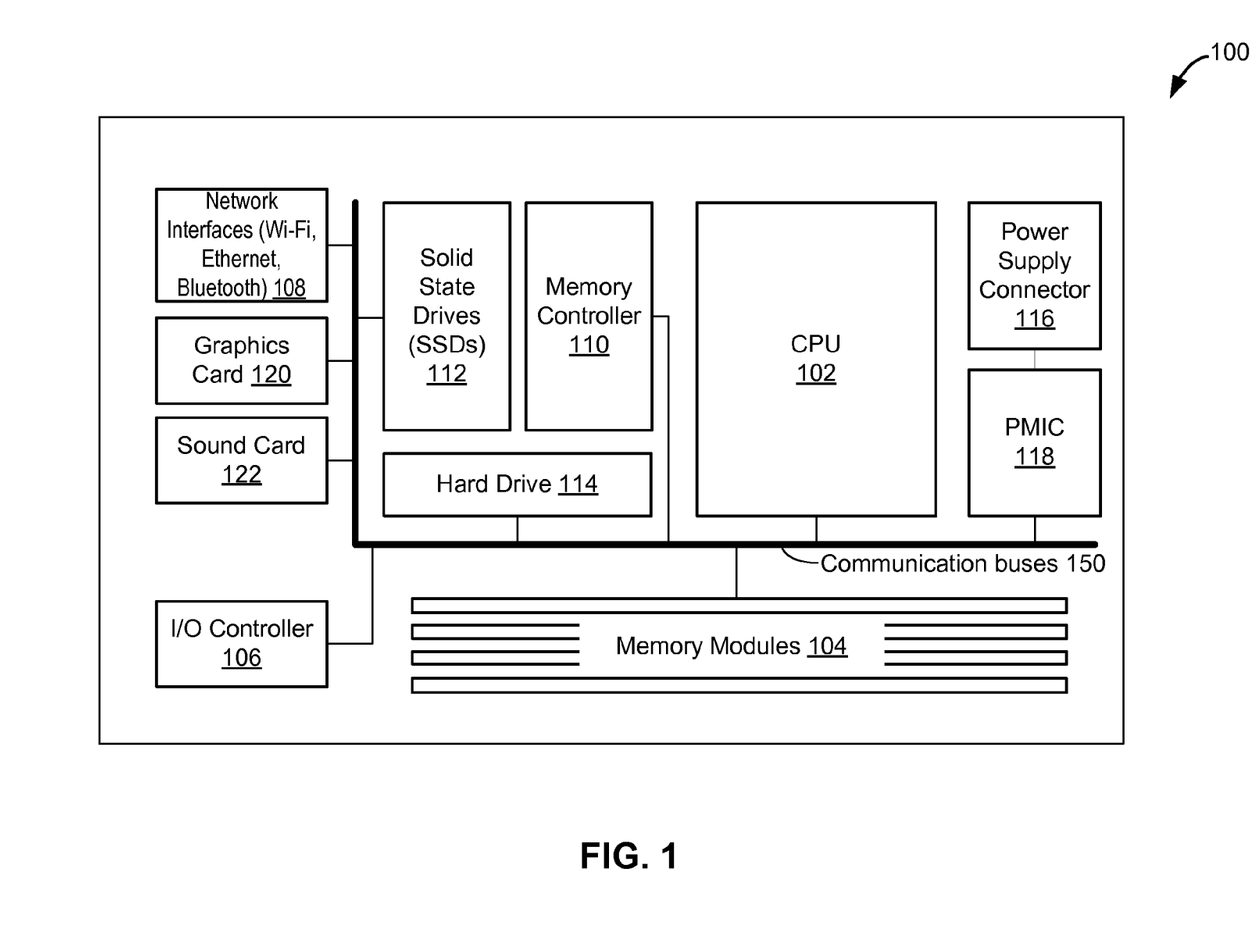
FIG. 1 is a block diagram of an exemplary system module in a typical computational device in accordance with some embodiments.

FIG. 1 is a block diagram of an exemplary system module 100 in a typical computational device in accordance with some embodiments. The system module 100 in this computational device includes at least a central processing unit (CPU) 102, memory modules 104 for storing programs, instructions and data, an input/output (I/O) controller 106, one or more communication interfaces such as network interfaces 108, and one or more communication buses 150 for interconnecting these components. In some embodiments, the I/O controller 106 allows the CPU 102 to communicate with an I/O device (e.g., a keyboard, a mouse, a track-pad, etc.) via a universal serial bus interface (or any other suitable wired or wireless interface). In some embodiments, the network interfaces 108 include one or more interfaces for Wi-Fi, Ethernet, and/or Bluetooth networks, each allowing the computational device 100 to exchange data with an external source, such as a server or another computational device. In some embodiments, the communication buses 150 include circuitry (sometimes called a chipset) that interconnects and controls communications among various system components included in the system module.

In some embodiments, the memory modules 104 include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Furthermore, each type of memory device may have different configurations. For example, flash memory devices may be configured in a NAND or a NOR configuration.

The memory devices can be formed from passive elements, active elements, or both. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles or a charge storage dielectric material.

Multiple memory elements may be configured so that they are connected in series or such that each element is individually accessible. By way of non-limiting example, NAND devices contain memory elements (e.g., devices containing a charge storage region) connected in series. For example, a NAND memory array may be configured so that the array is composed of multiple strings of memory in which each string is composed of multiple memory elements sharing a single bit line and accessed as a group. In contrast, memory elements may be configured so that each element is individually accessible, e.g., a NOR memory array. One of skill in the art will recognize that the NAND and NOR memory configurations are exemplary, and memory elements may be otherwise configured.

The semiconductor memory elements included in a single device, such as memory elements located within and/or over the same substrate or in a single die, may be distributed in a two- or three-dimensional manner (such as a two dimensional (2D) memory array structure or a three dimensional (3D) memory array structure).

In a two dimensional memory structure, the semiconductor memory elements are arranged in a single plane or single memory device level. Typically, in a two dimensional memory structure, memory elements are located in a plane (e.g., in an x-z direction plane) which extends substantially parallel to a major surface of a substrate that supports the memory elements. The substrate may be a wafer on which the material layers of the memory elements are deposited and/or in which memory elements are formed or it may be a carrier substrate which is attached to the memory elements after they are formed.

The memory elements may be arranged in the single memory device level in an ordered array, such as in a plurality of rows and/or columns. However, the memory elements may be arranged in non-regular or non-orthogonal configurations as understood by one of skill in the art. The memory elements may each have two or more electrodes or contact lines, including a bit line and a word line.

A three dimensional memory array is organized so that memory elements occupy multiple planes or multiple device levels, forming a structure in three dimensions (i.e., in the x, y and z directions, where the y direction is substantially perpendicular and the x and z directions are substantially parallel to the major surface of the substrate).

As a non-limiting example, each plane in a three dimensional memory array structure may be physically located in two dimensions (one memory level) with multiple two dimensional memory levels to form a three dimensional memory array structure. As another non-limiting example, a three dimensional memory array may be physically structured as multiple vertical columns (e.g., columns extending substantially perpendicular to the major surface of the substrate in the y direction) having multiple elements in each column and therefore having elements spanning several vertically stacked planes of memory devices. The columns may be arranged in a two dimensional configuration, e.g., in an x-z plane, thereby resulting in a three dimensional arrangement of memory elements. One of skill in the art will understand that other configurations of memory elements in three dimensions will also constitute a three dimensional memory array.

By way of non-limiting example, in a three dimensional NAND memory array, the memory elements may be connected together to form a NAND string within a single plane, sometimes called a horizontal (e.g., x-z) plane for ease of discussion. Alternatively, the memory elements may be connected together to extend through multiple parallel planes. Other three dimensional configurations can be envisioned wherein some NAND strings contain memory elements in a single plane of memory elements (sometimes called a memory level) while other strings contain memory elements which extend through multiple parallel planes (sometimes called parallel memory levels). Three dimensional memory arrays may also be designed in a NOR configuration and in a ReRAM configuration.

A monolithic three dimensional memory array is one in which multiple planes of memory elements (also called multiple memory levels) are formed above and/or within a single substrate, such as a semiconductor wafer, according to a sequence of manufacturing operations. In a monolithic 3D memory array, the material layers forming a respective memory level, such as the topmost memory level, are located on top of the material layers forming an underlying memory level, but on the same single substrate. In some embodiments, adjacent memory levels of a monolithic 3D memory array optionally share at least one material layer, while in other embodiments adjacent memory levels have intervening material layers separating them.

In contrast, two dimensional memory arrays may be formed separately and then integrated together to form a non-monolithic 3D memory device in a hybrid manner. For example, stacked memories have been constructed by forming 2D memory levels on separate substrates and integrating the formed 2D memory levels atop each other. The substrate of each 2D memory level may be thinned or removed prior to integrating it into a 3D memory device. As the individual memory levels are formed on separate substrates, the resulting 3D memory arrays are not monolithic three dimensional memory arrays.

Further, more than one memory array selected from 2D memory arrays and 3D memory arrays (monolithic or hybrid) may be formed separately and then packaged together to form a stacked-chip memory device. A stacked-chip memory device includes multiple planes or layers of memory devices, sometimes called memory levels.

The term "three-dimensional memory device" (or 3D memory device) is herein defined to mean a memory device having multiple layers or multiple levels (e.g., sometimes called multiple memory levels) of memory elements, including any of the following: a memory device having a monolithic or non-monolithic 3D memory array, some non-limiting examples of which are described above; or two or more 2D and/or 3D memory devices, packaged together to form a stacked-chip memory device, some non-limiting examples of which are described above.

A person skilled in the art will recognize that the invention or inventions descried and claimed herein are not limited to the two dimensional and three dimensional exemplary structures described here, and instead cover all relevant memory structures suitable for implementing the invention or inventions as described herein and as understood by one skilled in the art.

In some embodiments, the memory modules 104 include non-volatile memory, such as one or more magnetic disk storage devices, optical disk storage devices, flash memory devices, or other non-volatile solid state storage devices. In some embodiments, the memory modules 104, or alternatively the non-volatile memory device(s) within memory modules 104, include a non-transitory computer readable storage medium. In some embodiments, memory slots are reserved on the system module 100 for receiving the memory modules 104. Once inserted into the memory slots, the memory modules 104 are integrated into the system module 100.

In many embodiments, the system module 100 further includes one or more components selected from:
  a memory controller 110 that controls communication between the CPU 102 and memory components, including the memory modules 104, in the computational device;
  solid state drives (SSDs) 112 that apply integrated circuit assemblies to store data in the computational device, and in some embodiments, are based on NAND or NOR memory configurations;
  a hard drive 114 that is a conventional data storage device used for storing and retrieving digital information based on electromechanical magnetic disks;
  a power supply connector 116 that is electrically coupled to receive an external power supply;
  power management integrated circuit (PMIC) 118 that modulates the received external power supply to other desired DC voltage levels, e.g., 5V, 3.3V or 1.8V, as required by various components or circuits within the computational device;
  a graphics card 120 that generates a feed of output images to one or more display devices according to their desirable image/video formats; and
  a sound card 122 that facilitates the input and output of audio signals to and from the computational device under control of computer programs.

It is noted that the one or more communication buses 150 also interconnect and control communications among various system components, including components 110-122 (as well as other components not listed).

Further, one of skill in the art will understand that other non-transitory computer readable storage media can be used. In particular, as new data storage technologies are developed, those new data storage technologies may be used in the memory modules described herein. These new non-transitory computer readable storage media include, but are not limited to, those manufactured from biological materials, nanowires, carbon nanotubes, and individual molecules, even though the respective data storage technologies are currently under development and are yet to be commercialized.

Some of the aforementioned components (or other components not mentioned) generate heat during normal operation. In some instances, they may be integrated with heat sinks in order to reduce the temperatures of the corresponding components. For example, the solid state drives 112 used in a blade server may have heat sinks mounted on the top of each individual dual in-line memory module (DIMM) or on an electronic assembly containing the DIMMs. Heat generated from electronic components in the DIMMs is conducted to the heat sinks, and dissipated by airflow generated by fans. However, as the data workload in these blade servers increases and the form factor of the DIMMs decreases (e.g., closely placed memory slots in the memory modules 104), it becomes more difficult for conventional heat sinks and high-speed fans to conduct and dissipate the heat effectively. More generally, as the size of electronic components decreases, and more and more electronic components are being placed in close proximity to one another on circuit boards, it becomes more difficult to keep the electronic components sufficiently cool. Furthermore, some form factors of solid state disk drives to not include a case and thus heat skinks cannot be integrated into the design of the case.

To address this issue, the various embodiments described herein describe electronic assemblies that separate heat generating components from heat sensitive components by using a thermal barrier interconnect. In some embodiments, by using a thermal barrier interconnect such as a flexible circuit board between two rigid printed circuit boards, a thermal barrier is formed. This thermal barrier is used to allow one board to operate at a reduced temperature in relation to the other board. For instance, a board with NAND flash can be at a reduced temperature in relation to the board which contains the NAND flash controller and power supply electronics. The difference can be as much as 20 degrees C. This means the NAND flash running at a lower temperature will have better data retention and therefore require less recycling of data (which is Write Amplification) and lengthen the drive life.

Furthermore, in some embodiments, electronic assemblies form a self-supporting tube or channel for directing airflow over electronic components of the assembly. In particular, a channel structure helps confine air flow to the space within the channel. Thus, by passing air through the channel (e.g., either by convection, fans, or any other technique), heat can be effectively removed from components that are within the channel, or that are otherwise thermally coupled to the channel (e.g., components that are mounted outside the channel but are thermally coupled to a heat sink within the channel). Because the channel structures confine the airflow to the space within the channel, better cooling performance can be achieved for a given amount of airflow than would otherwise be possible.

Figure 2:
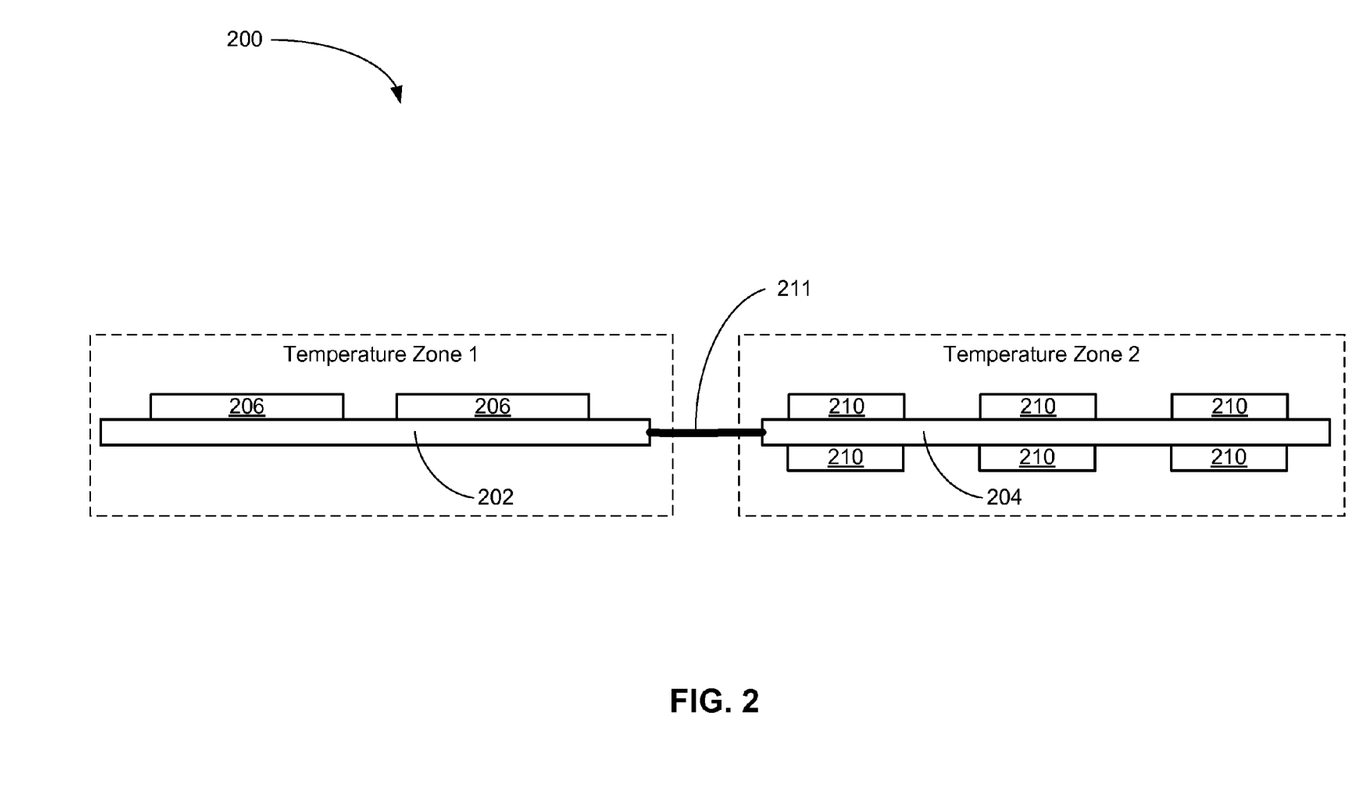
FIG. 2 is a side view of an exemplary electronic assembly, in accordance with some embodiments.

FIG. 2 is a side view of an exemplary electronic assembly, in accordance with some embodiments. FIG. 2 illustrates an embodiment of an electronic assembly 200 ("assembly 200"). In particular, the assembly 200 comprises a first circuit board 202 and a second circuit board 204. (Circuit boards are sometimes referred to herein simply as "boards.")

The first circuit board 202 includes with one or more heat generating components 206 coupled to it. The second circuit board 204 includes one or more heat sensitive components 210 coupled to it. In some embodiments, one or more heat sensitive components 210 are, or include, memory modules. In some embodiments, the one or more heat generating components 206 are, or include, processors, power supply electronics, and/or flash controllers.

In some embodiments, at least one of the first circuit board 202 and second circuit board 204 include one or more solid state drives (SSDs). In some embodiments, at least one of first circuit board 202 and second circuit board 204 include one or more three-dimensional (3D) memory devices.

The first board 202 and second board 204 are mechanically and/or electrically coupled via a thermal barrier interconnect 211. The thermal barrier interconnect 211 can carry electrical signals between two boards (e.g., the first board 202 and the second board 204), or between other electronic components or sub-assemblies. For example, the assembly 200 includes a thermal barrier interconnect 211 that mechanically and/or electrically couples the first board 202 to the second board 204.

In various embodiments, the thermal barrier interconnect 211 is a flexible board, flexible wire array, flexible PCB, flexible flat cable, ribbon cable (e.g., a flexible flat ribbon cable), or a combination thereof. In some embodiments, the flexible material is made from a kapton or other polyimide materials which has a lower thermal conductivity.

The thermal barrier interconnect 211 does not contain the thermal mass of the rigid FR4 (or other types) board material. As such, thermal barrier interconnect 211 produces in a thermal barrier. In some embodiments, the thermal barrier is further enhanced from the reduction in copper planes which are found in the rigid boards to supply power and grounds.

It will be understood that more or fewer flexible interconnects can be used to couple the boards of an electronic assembly in accordance with the ideas described in the instant application. For example, an electronic assembly may also include a fastener interconnect. One example of such an assembly is described herein with reference to FIG. 4.

Specifically, FIG. 2 shows an solid state disk constructed in such a way as to thermally isolate the heat generating components 206 such as power supply and NAND controller electronics (temperature zone 1) from the more temperature sensitive components 210, such as NAND flash (temperature zone 2). The thermal barrier interconnect 211 such as a flexible circuit board which connects the two boards provides an electrical connection between them, such that for instance it supplies the NAND power and data and controller signals (from the first board 202) for the NAND (on the second board 204).

It is further noted, that typically the NAND uses only two power supply connections, one for the CORE voltage and one for the I/O voltage. This means other power planes used by the NAND flash controller and support circuitry from the NAND PCBA are not needed in the thermal barrier interconnect 211. By removing the unused power planes from the NAND printed circuit board assembly you in turn remove some amount of thermal conduction to the main controller boards.

Figure 3A:
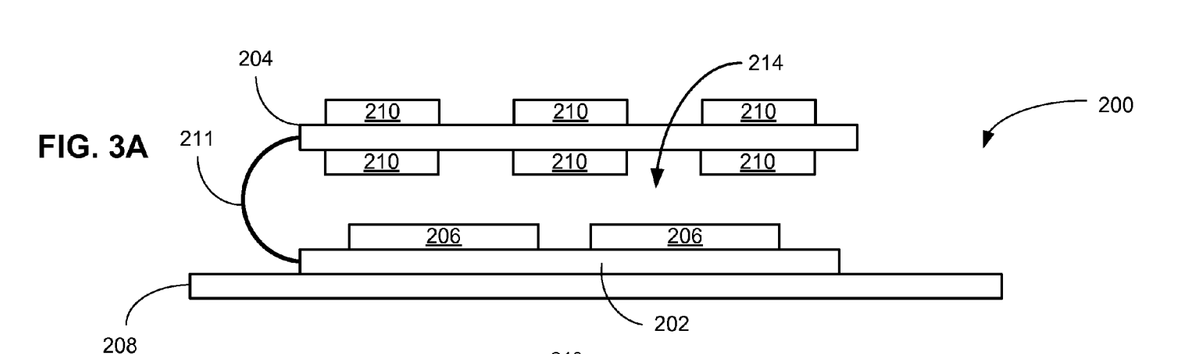
FIG. 3A is a side view of another exemplary electronic assembly, in accordance with some embodiments.
Figure 3B:
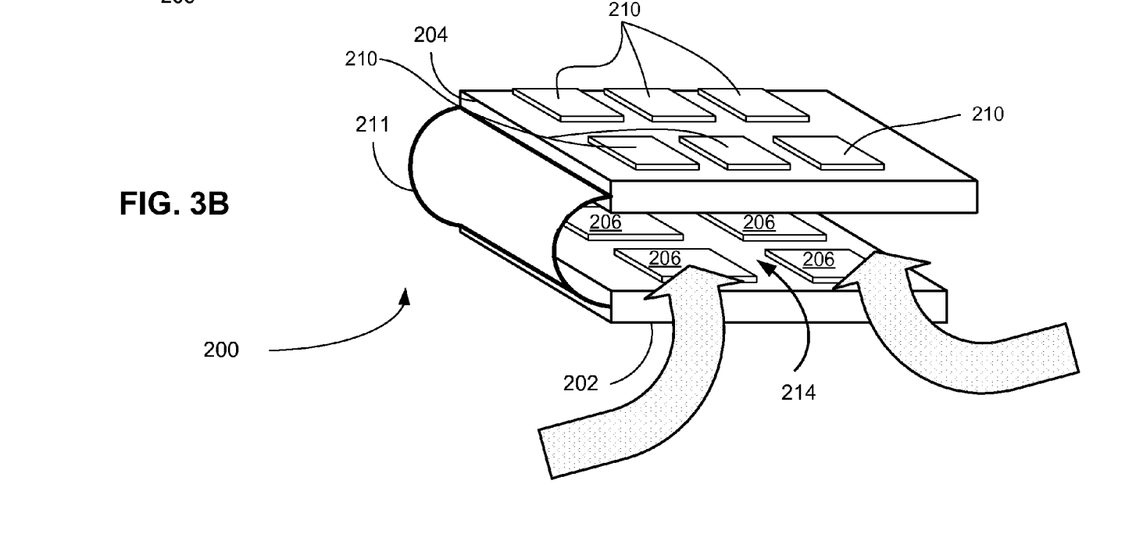
FIG. 3B is an oblique view of the exemplary electronic assembly of FIG. 3A, in accordance with some embodiments.

FIGS. 3A and 3B show a solid state disk drive form factor. In some embodiments, this form factor is used as a daughter board assembly on a larger SSD integration platform. In some embodiments, all of the NAND flash is on the outer board (e.g. the second board 204. This allows better exposure to airflow for lower temperature on the NAND in comparison to the main controller board.

This configuration along with the proper airflow has been shown to be 20 degree C. lower than the NAND temperature from the main controller board. Because a flexible circuit board is a standard impedance controlled PCB, there is no loss in signal strength of speed to the NAND flash board when a flexible circuit board is employed as the thermal barrier interconnect. From an electrical standpoint, this assembly is all one board with no schematic restrictions.

FIGS. 3A and 3B illustrate another embodiment of an electronic assembly 200 ("assembly 200"). In particular, the assembly 200 comprises a first circuit board 202 and a second circuit board 204.

The first circuit board 202 includes one or more heat generating components 206 coupled to it. The second circuit board 204 includes one or more heat sensitive components 210 coupled to it. In some embodiments, one or more heat sensitive components 210 are, or include, memory modules. In some embodiments, the one or more heat generating components 206 are, or include processors, power supply electronics, and/or flash controllers. In this embodiment, the first board is on a first plane and the second board is on a second plane substantially parallel to the fit first plane and is separated by a space 214.

In some embodiments, the assembly 200 is configured to be mechanically and/or electrically coupled to a base board (e.g., base board 208). In some embodiments, the base board is a mother board of a computer. In some embodiments, the base board is any circuit board to which the assembly 200 is configured to be coupled. In some embodiments, the assembly 200 is a daughter board assembly.

The first board 202 and second board 204 are mechanically and/or electrically coupled via a thermal barrier interconnect 211. For example, the assembly 200 includes a thermal barrier interconnect 211 that mechanically and/or electrically couples the first board 202 to the second board 204. In various embodiments, the thermal barrier interconnect 211 is a flexible board, flexible wire array, flexible PCB, flexible flat cable, ribbon cable (e.g., a flexible flat ribbon cable), or a combination thereof. The thermal barrier interconnect 211 can carry electrical signals between two boards (e.g., the first board 202 and the second board 204), or between other electronic components or sub-assemblies.

It will be understood that more or fewer flexible interconnects can be used to couple the boards of an electronic assembly in accordance with the ideas described in the instant application. For example, an electronic assembly may also include a fastener interconnect. One example of such an assembly is described herein with reference to FIG. 4.

Returning to FIGS. 3A and 3B, the boards 202, 204 have been configured such that a space 214 is formed between the first board 202, the second board 204. Furthermore, the second board 204 is located further away from the base board 208. Both of these features allow for better exposure to airflow and thus for lower temperature on the second board 204 in comparison to the first board 202.

Figure 4:
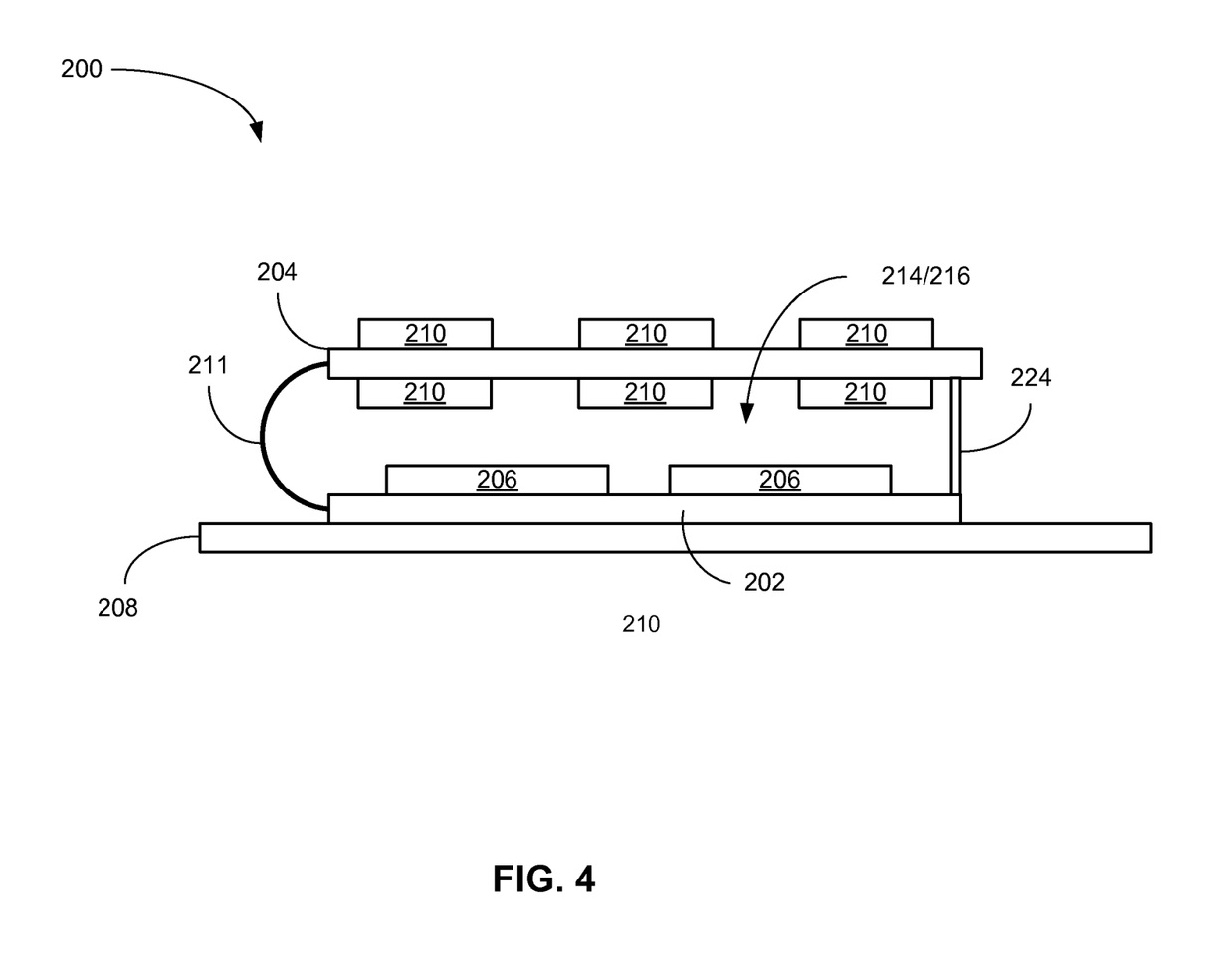
FIG. 4 is a side view of another exemplary electronic assembly, in accordance with some embodiments.

FIG. 4 is side view of another exemplary electronic assembly, in accordance with some embodiments. FIG. 4 is similar to the embodiment of FIGS. 3A and 3B and includes the same elements described therein. It additionally includes at least one fastener 224. The fastener(s) are configured to couple the first circuit board 202 to the second circuit board 204, such that the fastener 224, first circuit board 202, second circuit board 204, and thermal barrier interconnect 211 surround the space 214 and form an air flow channel 216.

Air can then pass through this channel 216 (e.g., with a fan, compressed air, convection, etc.) in order to remove heat from the electronic components (such as the one or more heat generating components 206 and the one or more heat sensitive components 210). The one or more fastener(s) 224 include any structure(s), component(s), or device(s) that mechanically and/or electrically couple the first board 202 and the second board 204. For example, the one or more fastener(s) 224 can be any of the group consisting of: a clip, a screw, a bolt, a nut, a solder tab and/or soldered connection, adhesive, a slot, a hole, a peg, a protrusion, or the like (or any combination of the foregoing items). In some embodiments, the fastener(s) have low or no thermal conductivity. For instance, they may be made of an electrostatic (ESD) discharge plastic, a static dissipative plastic, a composite material, or the like.

It is noted that, in some embodiments the channel 216 is formed without the need for external supports, rails, brackets, or other hardware, reducing the cost and complexity of the assembly 200 while still providing the increased cooling capacity that is made possible by such a channel. In particular, because the channel 216 can be formed simply by joining the first board 202 and the second board 204, the assembly 200 can be more easily manufactured than structures that require more complicated mounting hardware. Moreover, because the entire assembly 200 can be soldered together the resulting assembly is more robust than an assembly that uses less secure mounting or attachment techniques. Specifically, the soldered connections may be more resistant to separation or loosening caused by the heating and cooling cycles that are frequently present in computer hardware.

As shown in FIG. 4, the channel 216 is supported on one side by the thermal barrier interconnect 211 (typically a flexible interconnect such as a flexible circuit board). For example, the thermal barrier interconnect 211 joins the first board 202 and the second board 204, and, when the assembly is formed into a channel 216, the thermal barrier interconnect 211 provides structural support to keep the first board 202 separate from the second board 204. Although the thermal barrier interconnect 211 is rigid enough to maintain separation of the first board 202 and the second board 204 when the assembly is completed, it is flexible enough to provide a pliable joint so that the boards can be moved with respect to one another without damaging the connections. This allows the boards to be manipulated with respect to one another for ease of installation and assembly. For example, the assembly 200 may be mounted to a base board (e.g., base board 208, FIG. 3A). Then the second board 204 is coupled to the first board 202 by means of one or more fasteners 224 to form the channel 216. Thus, in some embodiments, the thermal barrier interconnect 211 is flexible enough to allow the boards to be moved relative to one another, but are rigid enough to support the channel 216 under normal operating conditions and orientations (e.g., so that the channel 216 does not collapse).

In some embodiments, multiple assemblies 200 are combined to form a substantially continuous channel 216. For example, in some embodiments, several assemblies 200 are coupled to one or more base boards such that the respective channels 216 are substantially aligned, thus allowing air to pass through the respective channels. In some embodiments, where multiple assemblies 200 form a single channel, the assemblies 200 are coupled to one another so as to form a substantially continuous channel. For example, in some embodiments, gaskets, seals, rails, or any other appropriate components, are positioned between two adjacent assemblies in order to prevent air from escaping the channel.

Figure 5:
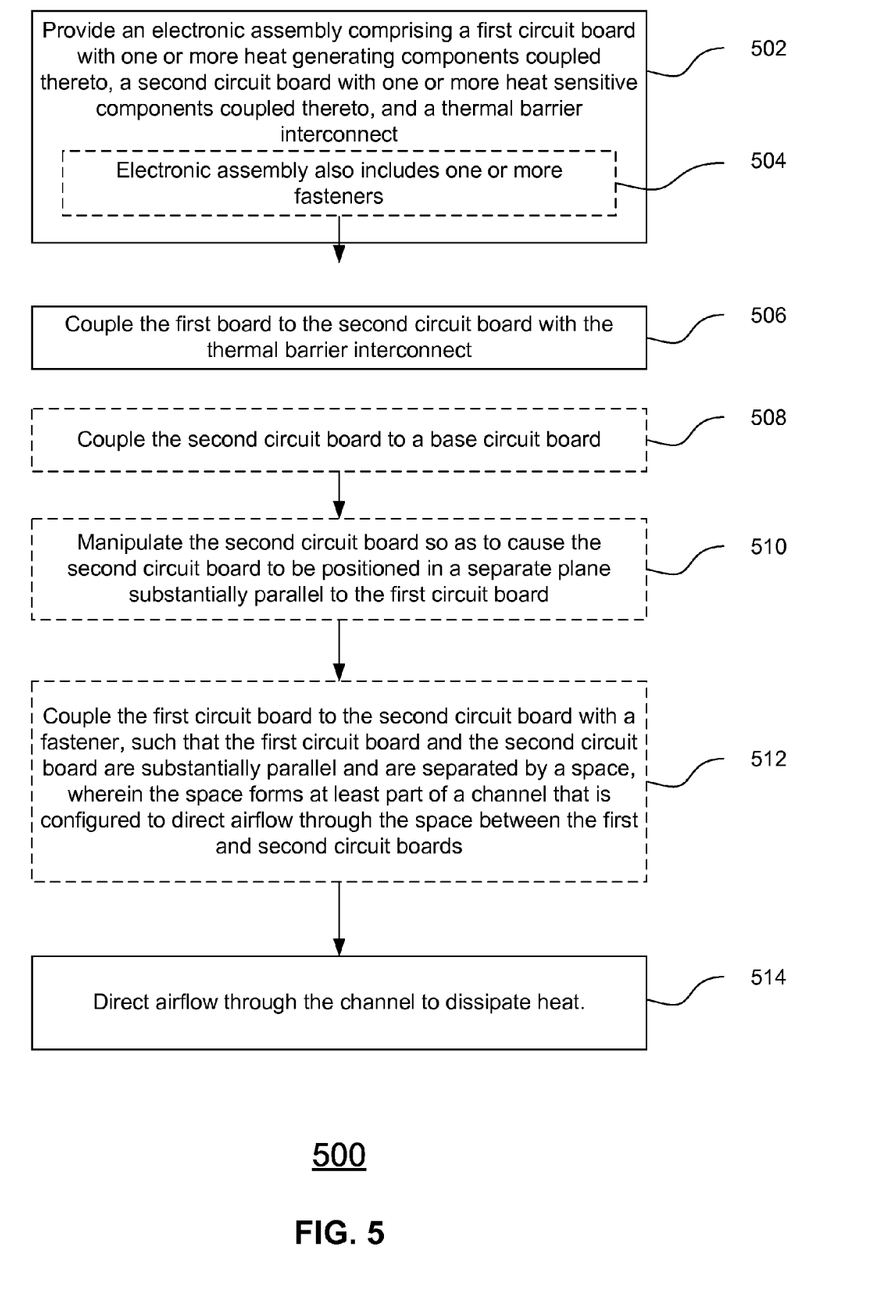
FIG. 5 illustrates an exemplary flow chart of a method for assembling and using an electronic assembly, in accordance with some embodiments.

FIG. 5 illustrates an exemplary flow chart of a method 500 for manufacturing and using an electronic assembly for dissipating heat, according to some embodiments. A first electronic assembly is provided (502). The electronic assembly includes a first circuit board (e.g., the first circuit board 202), a second circuit board (e.g., the second circuit board 204), and a thermal barrier interconnect (e.g., thermal barrier interconnect 211). In some embodiments, the electronic assembly also includes one or more fasteners (e.g., the one or more fastener(s) 224) (504).

Then the first circuit board is coupled to the second circuit board with the thermal barrier interconnect (506). In some embodiments, the first circuit board, the second circuit board, and the thermal barrier interconnect are next to one another in a substantially common plane as illustrated in FIG. 2.

In some embodiments, the second circuit board is coupled to a base circuit board (e.g., base board 208) (508).

In some embodiments, the electronic assembly (e.g., the second circuit board) is then manipulated (e.g., by machine or by hand) so as to cause the second circuit board to be positioned in a separate plane substantially parallel to the first circuit board (510). Manipulating the second circuit board so as to cause the second circuit board to be positioned substantially parallel to the first circuit board causes at least a portion of the thermal barrier interconnect 211 coupling the first circuit board to the second circuit board to be deformed as illustrated in FIGS. 3A and 3B.

In some embodiments, the first circuit board is coupled to the second circuit board with a fastener (e.g., the one or more fastener(s) 224), such that the first circuit board and the second circuit board are substantially parallel and are separated by a space 214, wherein the space forms at least part of a channel (e.g., channel 216) that is configured to direct airflow through the space between the first and second circuit boards as illustrated in FIG. 4 (512).

Thereafter, airflow is passed or directed (514) through the channel to dissipate heat, as described above.

It will be understood that, although the terms "first," "second," etc. may be used herein to describe various elements, these elements should not be limited by these terms. These terms are only used to distinguish one element from another. For example, a first contact could be termed a second contact, and, similarly, a second contact could be termed a first contact, which changing the meaning of the description, so long as all occurrences of the "first contact" are renamed consistently and all occurrences of the second contact are renamed consistently. The first contact and the second contact are both contacts, but they are not the same contact.

The terminology used herein is for the purpose of describing particular embodiments only and is not intended to be limiting of the claims. As used in the description of the embodiments and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof As used herein, the term "if" may be construed to mean "when" or "upon" or "in response to determining" or "in accordance with a determination" or "in response to detecting," that a stated condition precedent is true, depending on the context. Similarly, the phrase "if it is determined [that a stated condition precedent is true]" or "if [a stated condition precedent is true]" or "when [a stated condition precedent is true]" may be construed to mean "upon determining" or "in response to determining" or "in accordance with a determination" or "upon detecting" or "in response to detecting" that the stated condition precedent is true, depending on the context.

The foregoing description, for purpose of explanation, has been described with reference to specific embodiments. However, the illustrative discussions above are not intended to be exhaustive or to limit the claims to the precise forms disclosed. Many modifications and variations are possible in view of the above teachings. The embodiments were chosen and described in order to best explain principles of operation and practical applications, to thereby enable others skilled in the art.

What is claimed is:

1. An electronic assembly for dissipating heat, comprising:
   a first rigid circuit board having a first predefined thermal conductivity, with one or more heat generating components coupled thereto;
   a second rigid circuit board having a second predefined thermal conductivity, with one or more heat sensitive components coupled thereto, wherein the one or more heat sensitive components are more sensitive to heat than the one or more heat generating components; and
   a flexible circuit board having a third predefined thermal conductivity, wherein the third predefined thermal conductivity is less than the first and second predefined thermal conductivities, the flexible circuit board electrically coupling the first rigid circuit board to the second rigid circuit board and forming, with the first and second rigid circuit boards, an airflow channel that directs airflow to dissipate heat generated by the one or more heat generating components.

2. The electronic assembly of claim 1, wherein the flexible circuit board is made from a kapton material.

3. The electronic assembly of claim 1, wherein the flexible circuit board is made from a polyimide material.

4. The electronic assembly of claim 1, wherein the flexible circuit board has a lower thermal mass than the first and second rigid circuit boards.

5. The electronic assembly of claim 1, wherein the flexible circuit board includes power planes for CORE voltage and the I/O voltage.

6. The electronic assembly of claim 5, wherein the flexible circuit board does not include a plurality of power planes found in the first and second rigid circuit boards.

7. The electronic assembly of claim 1, wherein the one or more heat generating components include one or more power supply electronic components.

8. The electronic assembly of claim 1, wherein the one or more heat generating components include a NAND flash controller.

9. The electronic assembly of claim 1, wherein the one or more heat sensitive components include NAND flash memory.

10. The electronic assembly of claim 1, wherein the first rigid circuit board, the second rigid circuit board are disposed next to one another in a substantially common plane.

11. The electronic assembly of claim 1, wherein the first rigid circuit board is on a first plane and the second rigid circuit board is on a second plane substantially parallel to the first plane and the first and second rigid circuit boards are separated by a space.

12. The electronic assembly of claim 11, further comprising a fastener configured to couple the first rigid circuit board to the second rigid circuit board, wherein the fastener, first rigid circuit board, second rigid circuit board, and flexible circuit board surround the space and form the air flow channel.

13. The electronic assembly of claim 1, wherein, in operation:
   the first rigid circuit board has a first temperature; and
   the second rigid circuit board has a second temperature lower than the first temperature.

14. The electronic assembly of claim 13, wherein, in operation, the second temperature is 5 to 20 degrees Celsius lower than the first temperature.

15. The electronic assembly of claim 1, wherein the electronic assembly is a solid state disk drive.

16. The electronic assembly of claim 1, wherein the electronic assembly does not include a case or a heat sink.

17. The electronic assembly of claim 1, wherein at least one of the first rigid circuit board and second rigid circuit board comprises one or more solid state drives (SSDs) or one or more three-dimensional (3D) memory devices.

18. A method of manufacturing an electronic assembly for dissipating heat, comprising:
   providing an electronic assembly, comprising:
      a first rigid circuit board having a first predefined thermal conductivity, with one or more heat generating components coupled thereto;
      a second rigid circuit board having a second predefined thermal conductivity, with one or more heat sensitive components coupled thereto, wherein the one or more heat sensitive components are more sensitive to heat than the one or more heat generating components; and
      a flexible circuit board having a third predefined thermal conductivity, wherein the third predefined thermal conductivity is less than the first and second predefined thermal conductivities;
   coupling the first rigid circuit board to the second rigid circuit board with the flexible circuit board; and
   forming, with the first and second rigid circuit boards and the flexible circuit board, an airflow channel that directs airflow to dissipate heat generated by the one or more heat generating components.

19. The method of claim 18, wherein the electronic assembly is configured to operate so that the second rigid circuit board operates at a temperature that is 5 to 20 degrees Celsius lower than the temperature of the first rigid circuit board in a steady state operation.

20. The method of claim 19, wherein at least one of the first rigid circuit board and the second rigid circuit board comprises one or more solid state drives (SSDs) or one or more three-dimensional (3D) memory devices.

21. A method of dissipating heat from an electronic assembly, comprising:
   providing an electronic assembly, comprising:
      a first rigid circuit board having a first predefined thermal conductivity, with one or more heat generating components coupled thereto;
      a second rigid circuit board having a second predefined thermal conductivity, with one or more heat sensitive components coupled thereto, wherein the one or more heat sensitive components are more sensitive to heat than the one or more heat generating components; and
      a flexible circuit board having a third predefined thermal conductivity, wherein the third predefined thermal conductivity is less than the first and second predefined thermal conductivities, wherein the first rigid circuit board is coupled to the second rigid circuit board with the flexible circuit board; and directing airflow through a space formed between the first rigid circuit board and the second rigid circuit board to dissipate heat.

22. The electronic assembly of claim 1, wherein the one or more heat generating components are coupled to one side of the first rigid circuit board, and the heat sensitive components are coupled to both sides of the second rigid circuit board.

23. The electronic assembly of claim 22, wherein the first rigid circuit board is coupled to a base board.

* * * * *